United States Patent
Zheng et al.

(10) Patent No.: US 10,066,137 B2
(45) Date of Patent: Sep. 4, 2018

(54) ORGANOPOLYSILOXANE COMPOSITION, PREPARATION METHOD THEREFOR, AND SEMICONDUCTOR COMPONENT

(71) Applicant: GUANGZHOU HUMAN CHEM CO., LTD., Guangzhou (CN)

(72) Inventors: Haiting Zheng, Guangzhou (CN); Hai He, Guangzhou (CN); Jingwei Zhu, Guangzhou (CN); Guangyan Huang, Guangzhou (CN)

(73) Assignee: GUANGZHOU HUMAN CHEM CO., LTD., Guangzhou (CN)

( * ) Notice: Subject to any disclaimer, the term of this patent is extended or adjusted under 35 U.S.C. 154(b) by 56 days.

(21) Appl. No.: 15/507,238

(22) PCT Filed: Jan. 23, 2015

(86) PCT No.: PCT/CN2015/071380
§ 371 (c)(1),
(2) Date: Feb. 27, 2017

(87) PCT Pub. No.: WO2016/029643
PCT Pub. Date: Mar. 3, 2016

(65) Prior Publication Data
US 2017/0247590 A1    Aug. 31, 2017

(30) Foreign Application Priority Data
Aug. 27, 2014 (CN) .......................... 2014 1 0428763

(51) Int. Cl.
*C08G 77/12* (2006.01)
*C09J 183/04* (2006.01)
(Continued)

(52) U.S. Cl.
CPC .......... *C09J 183/04* (2013.01); *C08G 77/04* (2013.01); *C08G 77/08* (2013.01); *C08K 5/5435* (2013.01);
(Continued)

(58) Field of Classification Search
None
See application file for complete search history.

(56) References Cited

U.S. PATENT DOCUMENTS 5,373,078 A * 12/1994 Juen ..................... C08L 83/04
525/478
5,527,873 A * 6/1996 Kobayashi ............. C08G 77/06
525/478

(Continued)

FOREIGN PATENT DOCUMENTS

| CN | 101784631 | 7/2010 |
|----|-----------|--------|
| CN | 103154144 | 6/2013 |
| EP | 2628770 | 12/2014 |

*Primary Examiner* — Robert S Loewe

(57) ABSTRACT

The disclosed embodiments include an organopolysiloxane composition, a preparation method therefor, and a semiconductor component. The shore hardness of the cured product thereof is greater than A30 and less than A65. The composition comprises: (A1) solid 3D organopolysiloxane having an $R^1{}_3SiO_{1/2}$ unit and an $SiO_{4/2}$ unit; (A2) liquid straight-chain organopolysiloxane having an $R^1{}_3SiO_{1/2}$ unit and an $R^2{}_2SiO_{2/2}$ unit; the mixing viscosity of component (A1) and (A2) is between 6,000 and 20,000 mPa·s; (B) liquid straight-chain polyorganohydrosiloxane having an $R^3{}_3SiO_{1/2}$ unit and an $R^4{}_2SiO_{2/2}$ unit; (C) an organosiloxane tackifier in which one molecule has on average at least one epoxy group; (D) a hydrosilylation catalyst of a volume enough to promote the curing of the composition. The composition of the present invention and the cured semiconductor component thereof have good heat resistance, good adhesiveness (Continued)

with aluminum having a mirror finish and ceramic substrate, and good resistance to humidity.

11 Claims, 1 Drawing Sheet

(51) Int. Cl.

| | | |
|---|---|---|
| C08G 77/04 | (2006.01) | |
| C08G 77/08 | (2006.01) | |
| C09J 11/06 | (2006.01) | |
| H01L 33/48 | (2010.01) | |
| H01L 33/56 | (2010.01) | |
| H01L 33/60 | (2010.01) | |
| H01L 33/64 | (2010.01) | |
| C08L 83/04 | (2006.01) | |
| C08K 5/5435 | (2006.01) | |
| C08K 5/56 | (2006.01) | |
| C08L 83/00 | (2006.01) | |
| C08G 77/20 | (2006.01) | |
| C08G 77/00 | (2006.01) | |

(52) U.S. Cl.
CPC .............. *C08K 5/56* (2013.01); *C08L 83/00* (2013.01); *C08L 83/04* (2013.01); *C09J 11/06* (2013.01); *H01L 33/486* (2013.01); *H01L 33/56* (2013.01); *H01L 33/60* (2013.01); *H01L 33/641* (2013.01); *C08G 77/12* (2013.01); *C08G 77/20* (2013.01); *C08G 77/80* (2013.01); *H01L 2224/48091* (2013.01); *H01L 2224/48247* (2013.01)

(56) References Cited

U.S. PATENT DOCUMENTS

| | | | |
|---|---|---|---|
| 5,741,834 A * | 4/1998 | Ward ................... | C08L 83/04 523/213 |
| 2005/0006794 A1* | 1/2005 | Kashiwagi ............ | C08L 83/04 257/788 |
| 2006/0275617 A1 | 12/2006 | Miyoshi et al. | |
| 2008/0242807 A1 | 10/2008 | Aoki | |
| 2011/0097579 A1 | 4/2011 | Mizuno et al. | |
| 2011/0203664 A1* | 8/2011 | Howell ............ | B32B 17/10018 136/259 |
| 2013/0323428 A1* | 12/2013 | Ochs ................... | C08L 83/04 427/331 |
| 2015/0362628 A1* | 12/2015 | Dent ................... | C08L 83/04 252/602 |

\* cited by examiner

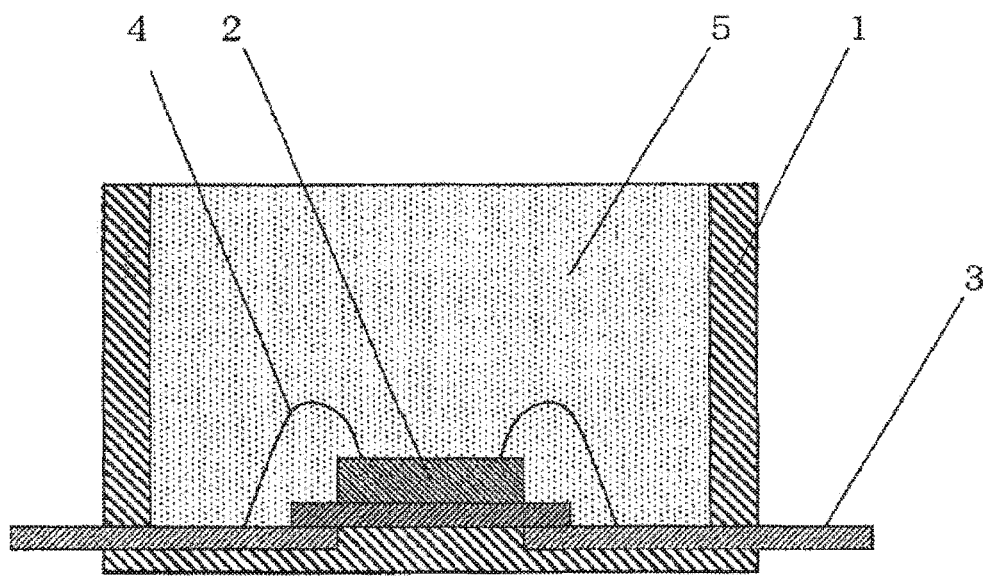

ORGANOPOLYSILOXANE COMPOSITION, PREPARATION METHOD THEREFOR, AND SEMICONDUCTOR COMPONENT

FIELD OF THE INVENTION

The present invention relates to a silicone composition and, more particularly, to an organopolysiloxane composition configured to be attached to a iron substrate, the preparation method thereof, and a semiconductor component formed by curing the composition.

BACKGROUND OF THE INVENTION

A basic structural unit of a silicone polymer consists of silicon-oxygen chains, through silicon atoms, side chains are connected with other various organic groups. Compared with other polymer materials, the silicone polymer has the following outstanding properties: 1. Heat-resistance: a silicone product is constituted by a main chain of silicon oxygen (Si—O) bonds, therefore, silicone products have high temperature resistance, and the molecular bond will not break or decompose at a high temperature (or irradiation). 2. Weather resistance: the main chain of a silicone product consists of —Si—O—, which has better thermostability, radiation resistance, weather resistance, and longer service life under natural environments. 3. Electrical insulation properties: a silicone product has good electrical insulation properties, its dielectric loss, withstand voltage, corona-resistance, volume resistivity and surface resistivity are all among the best in insulating materials, furthermore, its electrical performances are hardly effected by temperatures and frequencies. Thus, based on the aforementioned good properties, as a kind of silicone products, organopolysiloxane is widely used in LED package and photovoltaic industry.

CN103342816A describes a curable organopolysiloxane composition, which is used in LED lamp package and has the following advantages: excellent adhesion, high hardness, excellent thermal shock resistance, high transparency, etc.

Generally, a LED lamp package comprises a light-emitting component and a LED support, the light-emitting component is fixed on the LED support, the LED support is usually made of a metal substrate, the metal substrate is provided thereon with a silver coating, and the silver coating is used for focusing or diffusing the light of the light-emitting component. By coating the organopolysiloxane composition on the light-emitting component and the silver coating of the LED support and performing curing, the packaging of LED lamp is basically completed.

In the prior art, the LED support is usually made of copper material, a copper support has good performance in reducing resistance, increasing heat conduction and heat radiation, and extending service life, and is widely used in LED products.

As a new generation of Chip On Board (COB) substrate, a mirror finish aluminum substrate has a high reflectivity of 98% or more, with the thermoelectric separation design further reducing thermal resistance effectively, the mirror finish aluminum substrate is less susceptible to oxidation compared with a silver-plated support, and its cost is less than that of silver-plated support. COB has now been widely used in various types of lamps, and has a very good performance in both the light type and light effects.

With the development of LED industry, LED products advance toward high power, and plastic supports have been gradually unable to meet the cooling needs. A ceramic support has low expansion coefficient, high match degree with chips, high thermal conductivity, fast heat dissipation, high voltage insulation, anti-lightning shock performance, zero absorption of moisture, anti-oxidation performance, corrosion-resistance and high temperature resistance, and thus it is a high power LED support of the new generation.

However, when the organopolysiloxane composition in the prior art is applied to high power supports, such as a mirror finish aluminum support, a ceramic support, a copper COB support or an integrated support, there exists a problem of heat resistance of silicon, which is mainly manifested as cracking of silicon caused by heat produced by an LED lamp during a process of long-term and high-power use, and affects the life span of an LED lamp.

SUMMARY OF THE INVENTION

A technical problem to be solved by the present invention is to overcome the defect of the poor heat resistance of silicone used for integrated package in the prior art, and provide a curable organopolysiloxane composition with good heat resistance.

In order to solve the above technical problems, the present invention also provides a semiconductor component, the semiconductor component comprises a light-emitting component and a support configured to fix the light-emitting component, wherein the support is any one of a copper support, a mirror finish aluminum support, a ceramic substrate support, a COB support or an integrated support, and the light-emitting component is coated with cured substance of the organopolysiloxane composition of the present invention.

With respect to the organopolysiloxane composition provided by the present invention, in a cured state, it has a shore hardness greater than A30 and less than A65. The composition comprises:

(A1) solid three-dimensional structured organopolysiloxane comprising an $R^1{}_3SiO_{1/2}$ unit and a $SiO_{4/2}$ unit, wherein $R^1$ is selected from similar or different alkenyl groups, univalent substituted or unsubstituted hydrocarbyls which do not contain any aromatic hydrocarbon and aliphatic unsaturated bond; wherein the number-average molecular weight of organopolysiloxane is 2500-3500;

(A2) liquid straight-chain organopolysiloxane comprising an $R^1{}_3SiO_{1/2}$ unit and an $R^2{}_2SiO_{2/2}$ unit, wherein $R^1$ and $R^2$ are selected from similar or different alkenyl groups, univalent substituted or unsubstituted hydrocarbyls which do not contain any aromatic hydrocarbon and aliphatic unsaturated bond; wherein component (A1) and (A2) have a mixing viscosity between 6000 and 20000 mPa·s;

(B) liquid straight-chain polyorganohydrosiloxane comprising an $R^3{}_3SiO_{1/2}$ unit and an $R^4{}_2SiO_{2/2}$ unit, wherein $R^3$ and $R^4$ are selected from similar or different, univalent substituted or unsubstituted hydrocarbyls and hydrogen atoms, which do not contain any aromatic hydrocarbon and aliphatic unsaturated bond; wherein the molar ratio of silicon-bonded hydrogen atoms in the component (B) to the alkenyl groups in the component (A1) and (A2) is 1.1-2.0;

(C) an organosiloxane tackifier in which one molecule has on average at least one epoxy group;

(D) a hydrosilylation catalyst of an amount enough to promote the curing of the composition.

Wherein, the component (A1) is one of the main components of the composition of the present invention, the alkenyl groups in the component (A1) and (A2) react with the silicon-bonded hydrogen atoms in the component (B) to form cross-linked bonds and cure. The molecular structure of the component (A1) is a solid three-dimensional molecular chain structure, and one molecule should contain an $R^1_3SiO_{1/2}$ unit and a $SiO_{4/2}$ unit. The alkenyl groups of the component (A1) may represent vinyl, propenyl, butenyl, pentenyl and hexenyl, most preferably vinyl. The univalent substituted or unsubstituted hydrocarbonyls which do not contain any aromatic hydrocarbon and aliphatic unsaturated bond of the component (A1) can comprise the following groups: methyl, ethyl, propyl, butyl, pentyl, hexyl, heptyl or other similar alkyls, chloromethane, 3-chloropropyl or other similar haloalkyls, most preferably methyl. In order to further improve the reactivity of the component (A1) and component (B), the content of the alkenyl groups is 0.01-0.30 mol/100 g, and preferably 0.02-0.25 mol/100 g; the number-average molecular weight of the component (A1) is 2500-3500, when the number-average molecular weight is less than 2500, the initial adhesive strength after curing becomes poor; and when the number-average molecular weight is more than 3500, the hardness of the cured material is too high, the cured material is prone to crack in long-term work under a high temperature, resulting in peeling of a colloid from the substrate.

As a preferred embodiment of the present invention, the component (A1) has the following average unit formula:

$$(SiO_{4/2})_{a1}(R^5R^6_2SiO_{1/2})_{a2},$$

Wherein $R^5$ is selected from similar or different alkenyl groups, $R^6$ is selected from alkenyl groups and similar or different alkyl groups that are univalent substituted or unsubstituted, wherein $0.5<a1<0.99$, $0.01<a2<0.5$, and $a1+a2=1$. The alkenyl groups in $R^5$ may represent vinyl, propenyl, butenyl, pentenyl and hexenyl, and most preferably vinyl. The univalent substituted or unsubstituted alkyl is methyl, ethyl, propyl, butyl, pentyl, hexyl, heptyl or other similar alkyls, and most preferably methyl. The univalent substituted or unsubstituted alkyl in $R^6$ can comprise the following groups: methyl, ethyl, propyl, butyl, pentyl, hexyl, heptyl or other similar alkyls, and most preferably methyl.

For example, as a representative, the component (A1) may comprise the following average unit formula:

$$(SiO_{4/2})_{a1}(CH_2{=}CH(CH_3)_2SiO_{1/2})_{a2}$$

$$(SiO_{4/2})_{a1}((CH_2{=}CH)_2CH_3SiO_{1/2})_{a2}$$

Wherein, the component (A2) is one of the main components of the composition of the present invention, the molecular structure of the component (A2) is a liquid straight molecular chain structure, and one molecule should contain an $R^1_3SiO_{1/2}$ unit and an $R^2_2SiO_{2/2}$ unit. After the three-dimensional structure component (A1) and the straight chain structure component (A2) are blended, the alkenyl groups react with the silicon-bonded hydrogen atoms in the component (B) to form cross-linked bonds and cure. The alkenyl groups in component (A2) may represent vinyl, propenyl, butenyl, pentenyl and hexenyl, and most preferably vinyl. The univalent substituted or unsubstituted hydrocarbyl, which do not contain any aromatic hydrocarbon and aliphatic unsaturated bond in component (A2) can comprise the following groups: methyl, ethyl, propyl, butyl, pentyl, hexyl, heptyl or other similar alkyls, chloromethane, 3-chloropropyl and other similar haloalkyls, most preferably methyl. In order to further improve the reactivity of the component (A2) and component (B), the content of the alkenyl groups is 0.0001-0.01 mol/100 g, and preferably 0.0002-0.008 mol/100 g; the component (A1) and (A2) have a mixing viscosity between 6000 and 20000 mPa·s, when the viscosity is lower than 6000, the cured product is so soft that it is prone to peel off from the support; and when the viscosity is greater than 20000, the overall construction quality deteriorate.

As a preferred embodiment of the present invention, the component (A2) has the following average unit formula:

$$R^5R^6_2SiO(R^6_2SiO)_{a3}SiR^6_2R^5,$$

Wherein $R^5$ is selected from similar or different alkenyl groups, $R^6$ is selected from similar or different alkyl groups that are univalent substituted or unsubstituted, wherein $10<a3<10000$. The alkenyl groups in $R^5$ may represent vinyl, propenyl, butenyl, pentenyl and hexenyl, and most preferably vinyl. The univalent substituted or unsubstituted alkyl in $R^6$ can comprise the following groups: methyl, ethyl, propyl, butyl, pentyl, hexyl, heptyl or other similar alkyls, and most preferably methyl.

For example, as a representative, the component (A2) may comprise the following average unit formula:

$$CH_2{=}CH(CH_3)_2SiO(R^6_2SiO)_{a3}Si(CH_3)_2CH{=}CH_2.$$

In order to further improve the cooperation and synergy of the component (A2) to component (A1) after mixed, the viscosity of component (A2) is preferably between 5000 and 22000 mPa·s. The weight ratio of the component (A1) to the component (A2) ranges from 10:100 to 150:100, preferably from 20:100 to 150:100. When the viscosity of component (A2) is lower than 5000 mPa·s or greater than 22000 mPa·s, the synergy between component (A1) and (A2) or the properties will deteriorate.

The component (B) is one of the main components of the composition of the present invention, the silicon-bonded hydrogen atoms in this component react with the alkenyl groups in the component (A1) and (A2) to form cross-linked bonds and cure. The molecular structure of the component (B) is a liquid straight molecular chain structure, and one molecule should contain an $R^3_3SiO_{1/2}$ unit and an $R^4_2SiO_{2/2}$ unit. The univalent substituted or unsubstituted hydrocarbyl, which do not contain any aromatic hydrocarbon and aliphatic unsaturated bond in component (B) can comprise the following groups: methyl, ethyl, propyl, butyl, pentyl, hexyl, heptyl or other similar alkyls, chloromethane, 3-chloropropyl and other similar haloalkyls, most preferably methyl. The content of the silicon-bonded hydrogen atoms in the component (B) is 0.1-1.5 mol/100 g, preferably 0.2-1.5 mol/100 g. The molar ratio of silicon-bonded hydrogen atoms in the component (B) to the alkenyl groups in the component (A1) and (A2) is 1.1-2.0.

As a preferred embodiment of the present invention, the component (B) has the following average unit formula:

$$R^8_3SiO(R^8_2SiO)_{b1}(R^8HSiO)_{b2}SiR^8_3,$$

Wherein, $R^8$ is selected from similar or different alkyl groups that are univalent substituted or unsubstituted, wherein $0.2<b1<0.8$, $0.2<b2<0.8$, and $b1+b2=1$. The component (B) comprises the following groups: methyl, ethyl, propyl, butyl, pentyl, hexyl, heptyl or other similar alkyls, chloromethane, 3-chloropropyl and other similar haloalkyls, most preferably methyl.

For example, as a representative, the component (B) may comprise the following average unit formula:

$$(CH_3)_3SiO((CH_3)_2SiO)_{b1}(CH_3HSiO)_{b2}SiCH_3)_3.$$

The component (C), as a tackifier, is one of the main components of the composition of the present invention, in this organosiloxane component, one molecule has on average at least one epoxy group, as the component (C) of the present invention comprises the epoxy group, it has good adhesiveness with iron substrates. The molar equivalent of the epoxy group is preferably 150-500, and the molecular weight is preferably 200-5000.

The molecular structure of the component (C) of the present invention is not particularly limited, it can be an organosiloxane of straight chain, branched chain or cyclic structure, preferably straight chain and cyclic structure. As a preferred embodiment of the present invention, the component (C) has the following molecular structural formula,

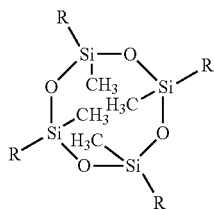

wherein, the R represents

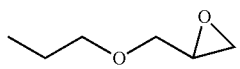

or a hydrogen atom.

In the present invention, component (D) is a catalyst to promote the hydrosilylation reaction between the alkenyl groups of the component (A1) and (A2) and the silicon-bonded hydrogen atoms of the component (B). In other words, the component (D) is a catalyst that promotes curing of the composition. Wherein, the present invention has no special restriction to the kind of catalysts, all catalysts that are commonly used in this field, such as platinum catalyst, rhodium catalyst or palladium catalyst may be used, and platinum catalyst is preferred in the present invention. Specific examples include platinum black, chloroplatinic acid, alcohol solutions of chloroplatinic acid, platinum-alkenylsiloxane complexes, platinum-olefin complexes, etc., preferably platinum-alkenylsiloxane complexes. The present invention employs a platinum catalyst having tetramethyl-vinyldisiloxane as a ligand. There is no special restriction to the content of the component (D), as long as the content is enough to promote the curing reaction of the composition.

The curable organopolysiloxane composition of the present invention further comprises a component (E) as an inhibitor of the addition reaction, which prolongs the shelf life of the curable organopolysiloxane composition of the present invention. The inhibitor of the addition reaction is a temperature-dependent substance, which loses its inhibitory effect rapidly when being heated to a certain extent, so that the composition generates a curing reaction. There is no special restriction to the kind, weight and content of the component (E), inhibitors commonly used in the art can be used, and can be added by an amount as required. For example, the component (E) of the present invention is ethynylcyclohexanol, and the addition amount thereof is 0.01% by weight of the total content of the composition.

There is no special restriction to the preparation methods of the components (A)-(E) in the present invention, the components can be obtained by preparation methods commonly used in the art or by commercial purchases.

There is no special restriction to the ratio of the content of the components (A1), (A2), (B), and (C) in the present invention, for example, the sum of the weight of the component (A1) and (A2) represents 70 wt %-95 wt % of the total weight of the composition, the component (B) represents 5 wt %-30 wt % of the total weight of the composition, and component (C) represents 0.01 wt %-10 wt % of the total weight of the composition.

In order to solve the above technical problems, the present invention also provides a preparation method for the organopolysiloxane composition, components (A1) and (A2) are blended to obtain a mixed solution having a mixing viscosity between 6000 and 20000 mPa·s, then components (B), (C) and (D) are blended with the mixed solution, component (E) and other addictives such as inorganic fillers, pigments, flame retardants, heat-resistant agents and the like are added as needed, and thus the curable organopolysiloxane composition is prepared.

The present invention provides a semiconductor component comprising a light-emitting component and a support configured to fix the light-emitting component, the aforementioned mixed composition is coated on the surface of the support for the light-emitting component and cured. For example, the temperature is kept at 100° C. for 1 h, and then cure at 150° C. for 3 h. A cured body that has a tensile strength of 2.0-5.4 Mpa and an elongation at break of 80%-180%, preferably 110%-160% at a temperature of 25° C. and a humidity of 60% RH is formed. The hardness thereof is measured at three points using a Shore A hardness tester and the average value is taken, the hardness is greater than A30 and less than A65. In contrast, it is difficult for a conventional organopolysiloxane composition to have such excellent heat resistance.

The present invention has the following beneficial effects: compared with the prior art, the composition and its cured semiconductor component of the present invention not only maintain good heat resistance, but also have a good adhesiveness with aluminum having a mirror finish and ceramic substrates and good resistance to humidity.

BRIEF DESCRIPTION OF THE DRAWINGS

FIG. 1 is a cross-sectional schematic view of a packaged semiconductor unit provided by an embodiment of the present invention;

The reference signs in the drawings are as follows:
1—LED support; 2—light-emitting component; 3—electrode; 4—wire; 5—cured body of a curable organopolysiloxane composition.

DETAILED DESCRIPTION OF THE PREFERRED EMBODIMENT

In order to make the purposes, technical solutions, and advantages of the present invention be clearer, the present invention will be further described in detail hereinafter with reference to accompany embodiments. It should be understood that the specific embodiments described here are only intended to illustrate the present invention, but not to limit the present invention.

In the following description, Vi refers to a vinyl group, and Me represents a methyl group.

Synthesis Example 1

Ethyl orthosilicate (10.9 g) is added into a flask, absolute ethyl alcohol (30 g) and concentrated hydrochloric acid having a concentration of 37% by mass (15 g) are added successively, and a reaction is performed at 70° C. for 5 min;

Tetramethyldivinyltetramethyldisiloxane (1.7 g) is added and refluxing is further performed for 60 min. The reactants are transferred into a separatory funnel, an acid layer is removed, the organic layer is washed with water into a neutral pH, and then transferred to a flask; deionized water (1 g) is added, refluxing is performed at 70° C. for 60 min, and the pressure is reduced by a pump. A MQ resin with the following structure is obtained:

The average formula $(ViMe_2SiO_{0.5})_{0.07}(SiO_2)_{0.93}$ (A1-1)

The component is solid at 25° C., has a number average molecular weight of 3000, and a vinyl content of 0.10 mol/100 g.

Synthesis Example 2

Ethyl orthosilicate (10.4 g) is added into a flask, absolute ethyl alcohol (30 g) and concentrated hydrochloric acid having a concentration of 37% by mass (15 g) are added successively, and a reaction is performed at 70° C. for 5 min; Tetramethyldivinyltetramethyldisiloxane (1.8 g) and Hexamethyldisiloxane (0.5 g) are added and refluxing is further performed for 60 min. The reactants are transferred into a separatory funnel, an acid layer is removed, the organic layer is washed with water into a neutral pH, and then transferred to a flask; deionized water (1 g) is added, refluxing is performed at 70° C. for 60 min, and the pressure is reduced by a pump. A MQ resin with the following structure is obtained:

The average formula $(ViMe_2SiO_{0.5})_{0.07}(Me_3SiO_{0.5})_{0.04}(SiO_2)_{0.89}$ (A1-2)

The component is solid at 25° C., has a number average molecular weight of 2500, and a vinyl content of 0.11 mol/100 g.

Synthesis Example 3

Ethyl orthosilicate (10.4 g) is added into a flask, absolute ethyl alcohol (30 g) and concentrated hydrochloric acid having a concentration of 37% by mass (15 g) are added successively, and a reaction is performed at 70° C. for 10 min; Tetramethyldivinyltetramethyldisiloxane (1.6 g) is added and refluxing is further performed for 180 min. The reactants are transferred into a separatory funnel, an acid layer is removed, the organic layer is washed with water into a neutral pH, and then transferred to a flask; deionized water (1 g) is added, refluxing is performed at 70° C. for 60 min, and the pressure is reduced by a pump. A MQ resin with the following structure is obtained:

The average formula $(ViMe_2SiO_{0.5})_{0.06}(SiO_2)_{0.94}$ (A1-3)

The component is solid at 25° C., has a number average molecular weight of 3500, and a vinyl content of 0.09 mol/100 g.

Synthesis Example 4

Ethyl orthosilicate (10.6 g) is added into a flask, absolute ethyl alcohol (30 g) and concentrated hydrochloric acid having a concentration of 37% by mass (15 g) are added successively, and a reaction is performed at 70° C. for 10 min; Tetramethyldivinyltetramethyldisiloxane (1.7 g) is added and refluxing is further performed for 240 min. The reactants are transferred into a separatory funnel, an acid layer is removed, the organic layer is washed with water into a neutral pH, and then transferred to a flask; deionized water (1 g) is added, refluxing is performed at 70° C. for 60 min, and the pressure is reduced by a pump. A MQ resin with the following structure is obtained:

The average formula $(ViMe_2SiO_{0.5})_{0.07}(SiO_2)_{0.93}$ (A1-4)

The component is solid at 25° C., has a number average molecular weight of 3700, and a vinyl content of 0.10 mol/100 g.

Synthesis Example 5

Ethyl orthosilicate (10.4 g) is added into a flask, absolute ethyl alcohol (30 g) and concentrated hydrochloric acid having a concentration of 37% by mass (15 g) are added successively, and a reaction is performed at 70° C. for 5 min; Tetramethyldivinyltetramethyldisiloxane (1.8 g) is added and refluxing is further performed for 45 min. The reactants are transferred into a separatory funnel, an acid layer is removed, the organic layer is washed with water into a neutral pH, and then transferred to a flask; deionized water (1 g) is added, refluxing is performed at 70° C. for 60 min, and the pressure is reduced by a pump. A MQ resin with the following structure is obtained:

The average formula $(ViMe_2SiO_{0.5})_{0.07}(SiO_2)_{0.93}$ (A1-5)

The component is solid at 25° C., has a number average molecular weight of 2200, and a vinyl content of 0.10 mol/100 g.

Synthesis Example 6

Octamethylcyclotetrasiloxane (52.6 g) and Tetramethyldivinyltetramethyl-disiloxane (2.5 g) are added into a flask and stirred well, tetramethylammonium hydroxide (2.5 g) is added successively, the temperature is raised to 120° C. and reaction is performed for 18 h, then the temperature is further raised to 180° C. and reaction is performed for 2 h, then the temperature is raised to 200° C. and substances with low boiling points are removed under a reduced pressure, a resin with the following structure is obtained:

$CH_2\!=\!CH(CH_3)_2SiO[(CH_3)_2SiO]_{341}Si(CH_3)_2CH\!=\!CH_2$ (A2-1)

The component is an organosilicon compound has a viscosity of 6000 mPa·s at 25° C., and a vinyl content of 0.007 mol/100 g.

Synthesis Example 7

Octamethylcyclotetrasiloxane (63.2 g) and Tetramethyldivinyltetramethyl-disiloxane (1.1 g) are added into a flask and stirred well, tetramethylammonium hydroxide (2.5 g) is added successively, the temperature is raised to 120° C. and reaction is performed for 18 h, then the temperature is further raised to 180° C. and reaction is performed for 2 h, then the temperature is raised to 200° C. and substances with low boiling points are removed under a reduced pressure, a resin with the following structure is obtained:

$CH_2\!=\!CH(CH_3)_2SiO[(CH_3)_2SiO]_{823}Si(CH_3)_2CH\!=\!CH_2$ (A2-2)

The component is an organosilicon compound has a viscosity of 15000 mPa·s at 25° C., and a vinyl content of 0.003 mol/100 g.

Synthesis Example 8

15 parts by mass of $Me_3SiOSiMe_3$, 60 parts by mass of $(Me_2SiO)_4$ and 40 parts by mass of $Me_3SiO(MeHSiO)$ $_m$SiMe$_3$ (From Chengdu Chenguang Chemical Research Institute) are blended, and seven parts by mass of concentrated sulfuric acid having a concentration of 98% by mass is added as catalyst, the mixture is equilibrated at room temperature for 5 h, the layers are allowed to stand, then an acid layer is removed, and an oil layer is neutralized with Na$_2$CO$_3$ for 30 min, a product with a yield up to 95% by mass fraction is obtained after filtration as follows:

Me$_3$SiO(MeHSiO)$_5$(Me$_2$SiO)$_{10}$SiMe$_3$ (B)

The component is an organosilicon compound has a viscosity of 56 mPa·s at 25° C., and a hydrogen content of 0.5 mol/100 g.

Synthesis Example 9

Tetramethylcyclotetrasiloxane (60 g), allyl glycidyl ether (200 g) and ethyl acetate (50 g) are added into a flask and stirred well, chloroplatinic acid in octanol solution (a platinum concentration of 5 wt %) is added dropwise, the temperature is raised to 80° C. and reaction is performed for 10 h, vacuumed to −0.095 MPa, then the temperature is raised to 170° C. and substances with low boiling points are removed under a reduced pressure, a resin with the following structure is obtained:

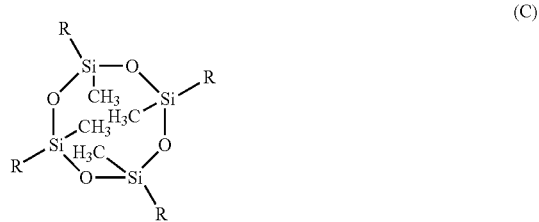

wherein, the R represents

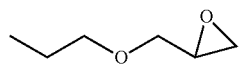

The component is an organosilicon compound has a viscosity of 30 mPa·s at 25° C.

Practical Examples 1-6 and Comparative Examples 1-6

The resins (A1-1)-(A1-5), (A2-1), (A2-2), (B), (C) as prepared by the synthesis example 1-10, a catalyst for the addition reaction (D): chloroplatinic acid in octanol solution (a platinum concentration of 5 wt %), and (E) an inhibitor: 2-Phenyl-3-butyn-2-ol are mixed; according to the combination as shown in Table 1, the components (A1) and (A2) are mixed at first, and the obtained mixture are mixed with the components (B), (C), (D) and (E), all components are calculated as parts by mass, and the compositions of the present invention are obtained.

The semiconductor device LED light shown in FIG. 1 is packaged in the following manner a LED support 1 (a 100 W integrated support) where a light-emitting component 2 is fixed is provided, wherein the light-emitting component 2 (S-23BBMUP-455 Chip from San' an) is connected with an electrode 3 by a wire 4 (23 μm gold wire from Beijing Dabo nonferrous metal solder limited liability company); by a dispenser, the deformed aforementioned curable organopolysiloxane composition 5 of the present invention is coated on the LED support 1 where a light-emitting component 2 is fixed and then cured, and thus an integrated package is obtained.

The physical and chemical properties of the obtained compositions are measured by the following means, and the results are recorded in Table 1.

The organopolysiloxane mixture is poured into a mold, heated and cured and made into a film, curing condition is as follows: cured at 100° C. for 1 h and then cured at 150° C. for 3 h. The physical properties of the film are measured, and the testing results are recorded in Table 1.

Hardness

The obtained composition is defoamed and 10 g of the defoamed composition is kept at 100° C. for 1 h, and then cured at 150° C. for 3 h; at 25° C. and 60% RH, the hardness thereof is measured at three points using a Shore A hardness tester, and the average value is recorded.

Tensile Strength and Elongation at Break

The obtained composition is defoamed and made into a sheet with a thickness of 2 mm, which is held at 100° C. for 1 h and then cured at 150° C. for 3 h; the sheet is then processed into a dumbbell-shape, and the tensile strength and elongation at break thereof are measured at 25° C. and 60% RH by a universal materials tester.

Heat Resistance

The obtained composition is defoamed and 0.7 g of the defoamed composition is dispensed on a 100 W integrated support, the dispensed composition is held at 100° C. for 1 h and then cured at 150° C. for 3 h, after cooling, it is then placed onto a 230° C. heating platform and heated for different time and then placed under room temperature, and the time the gel cracks is recorded.

TABLE 1

| Parts by mass | Practical Example1 | Practical Example2 | Practical Example3 | Practical Example4 | Practical Example5 | Practical Example6 |
|---|---|---|---|---|---|---|
| A1-1 | 40 | | | | | 35 |
| A1-2 | | 8.2 | | 6.6 | | |
| A1-3 | | | 51 | | 52 | |
| A1-4 | | | | | | |
| A1-5 | | | | | | |
| A2-1 | 40 | 82 | | 83 | | 43.2 |
| A2-2 | | | 34 | | 30.6 | |
| B | 17.9 | 7.8 | 12.9 | 8.3 | 15.3 | 19.7 |
| C | 2 | 1.9 | 2 | 2 | 2 | 2 |
| D | 0.1 | 0.1 | 0.1 | 0.1 | 0.1 | 0.1 |
| E | 0.02 | 0.02 | 0.02 | 0.02 | 0.02 | 0.02 |

TABLE 1-continued

| Parts by mass | Practical Example1 | Practical Example2 | Practical Example3 | Practical Example4 | Practical Example5 | Practical Example6 |
|---|---|---|---|---|---|---|
| Mixing viscosity of resin A1 and A2 | 13000 | 7000 | 18000 | 6000 | 20000 | 11000 |
| Si—H/Si—Vi (molar ratio) | 1.68 | 1.10 | 1.16 | 1.18 | 1.50 | 2.00 |
| Evaluation Result | | | | | | |
| Hardness (25° C.) | A50 | A30 | A60 | A30 | A60 | A45 |
| Tensile strength Mpa | 2.1 | 3.2 | 4.2 | 3.2 | 5.2 | 3.0 |
| Elongation at break % | 160 | 150 | 120 | 150 | 110 | 150 |
| Heat resistance time Before crack | 30 | 32 | 30 | 20 | 20 | 30 |

TABLE 2

| Parts by mass | Comparative Example1 | Comparative Example2 | Comparative Example3 | Comparative Example4 | Comparative Example5 | Comparative Example6 |
|---|---|---|---|---|---|---|
| A1-1 | | | | | | 35 |
| A1-2 | | | | 5 | | 8 |
| A1-3 | | | | | 55 | |
| A1-4 | 23 | | | | | |
| A1-5 | | 40 | | | | |
| A2-1 | 62 | 43 | 83 | | 83 | 40 |
| A2-2 | | | | 30 | | |
| B | 12.9 | 14.9 | 9.9 | 12.9 | 6.9 | 22.9 |
| C | 2 | 2 | 2 | 2 | 2.0 | 2 |
| D | 0.1 | 0.1 | 0.1 | 0.1 | 0.1 | 0.1 |
| E | 0.02 | 0.02 | 0.02 | 0.02 | 0.02 | 0.02 |
| Mixing viscosity of resin A1 and A2 | 9000 | 11000 | 4000 | 23000 | 6000 | 18000 |
| Si—H/Si—Vi (molar ratio) | 1.57 | 1.20 | 1.51 | 1.21 | 0.97 | 2.15 |
| Evaluation Result | | | | | | |
| Hardness (25° C.) | A70 | A48 | A35 | A70 | A40 | A60 |
| Tensile strength Mpa | 6.2 | 1.9 | 3.2 | 7.8 | 2.1 | 2.5 |
| Elongation at break % | 75 | 160 | 150 | 80 | 130 | 120 |
| Heat resistance time Before crack | 6 | 8 | 7 | 6 | 7 | 7 |

As can be seen from Table 1, the hardness is A30-A60 for practical examples 1-6, and the heat resistance time before crack is 20-32 h; as can be seen from Table 2, the heat resistance time before crack of comparative examples 1-6 is only 6-8 h. Thus, the embodiments of the present invention have excellent heat resistance.

As can be seen from Table 1, the MQ resins of practical examples 1-6 have a molecular weight range from 2500 to 3500 (component A1-1 to A1-3) and have excellent heat resistance; as can be seen from Table 2, component A1-4 of comparative example 1 has a number average molecular weight of 3700, whereas component A1-5 of comparative example 2 has a number average molecular weight of 2200, both of which have poor heat resistance.

As can be seen from Table 1, the mixing viscosity of component A1 and A2 of practical examples 1-6 is between 6000 and 20000, and have excellent heat resistance; as can be seen from Table 2, the mixing viscosity of component A1 and A2 from comparative example 3 is 4000, whereas the mixing viscosity of component A1 and A2 from comparative example 4 is 23000, both of which have poor heat resistance.

As can be seen from Table 1, the molar ratio of Si—H/Si-Vi in practical examples 1-6 is between 1.1 and 2, the composition is fully cured and has excellent heat resistance; as can be seen from Table 2, the molar ratio of Si—H/Si-Vi in comparative example 5 is 0.97, whereas the molar ratio of Si—H/Si-Vi in comparative example 6 is 2.15, both of which have poor heat resistance.

The advantageous effects of the present invention: comparing with the prior art, the composition of the present invention and the cured semi-conductive component thereof not only have good heat resistance, but also have good adhesiveness with aluminum having a mirror finish and ceramic substrates, and good resistance to humidity.

The above contents are only preferred embodiments of the present invention, and are not intended to limit the present invention. Any modification, equivalent replacement or improvement made within the spirit and principle of the present invention should be included in the protection scope of the present invention.

What is claimed is:

1. A organopolysiloxane composition, wherein, in its cured state, a cured product thereof has a shore hardness greater than A30 and less than A65, and the composition comprises:
   (A1) solid three-dimensional structured organopolysiloxane comprising an $R^1_3SiO_{1/2}$ unit and a $SiO_{4/2}$ unit, wherein $R^1$ is selected from similar or different alkenyl groups, univalent substituted or unsubstituted hydrocarbyls which do not contain any aromatic hydrocarbon and aliphatic unsaturated bond; wherein the number-average molecular weight of organopolysiloxane is 2500-3500;
   (A2) liquid straight-chain organopolysiloxane comprising an $R^1_3SiO_{1/2}$ unit and an $R^2_2SiO_{2/2}$ unit, wherein $R^1$ and $R^2$ are selected from similar or different alkenyl groups, univalent substituted or unsubstituted hydrocarbyls which do not contain any aromatic hydrocarbon and aliphatic unsaturated bond; wherein component (A1) and (A2) have a mixing viscosity of 6000 to 20000 mPa·s;

(B) liquid straight-chain polyorganohydrosiloxane comprising an $R^3_3SiO_{1/2}$ unit and an $R^4_2SiO_{2/2}$ unit, wherein $R^3$ and $R^4$ are selected from similar or different, univalent substituted or unsubstituted hydrocarbyls and hydrogen atoms, which do not contain any aromatic hydrocarbon and aliphatic unsaturated bond; wherein the molar ratio of silicon-bonded hydrogen atoms in the component (B) to the alkenyl groups in the component (A1) and (A2) is 1.1-2.0;

(C) an organosiloxane tackifier in which one molecule has on average at least one epoxy group;

(D) a hydrosilylation catalyst of a volume enough to promote the curing of the composition.

2. The organopolysiloxane composition according to claim 1, wherein, the viscosity of component (A2) is 5000 to 22000 mPa·s, and the content of the alkenyl groups is 0.0001-0.01.

3. The organopolysiloxane composition according to claim 1, wherein, the sum of the weight of the component (A1) and (A2) represents 70 wt %-95 wt % of the total weight of the composition, the component (B) represents 5 wt %-30 wt % of the total weight of the composition, and component (C) represents 0.01 wt %-10 wt % of the total weight of the composition.

4. The organopolysiloxane composition according to claim 1, wherein, the component (A1) and (A2) have a mixing viscosity of 6000 to 18000 mPa·s.

5. The organopolysiloxane composition according to claim 1, wherein, the weight ratio of the component (A1) to the component (A2) ranges from 10:100 to 150:100.

6. The organopolysiloxane composition according to claim 1, wherein, the component (A1) has the following average unit formula, $(SiO_{4/2})_{a1}(R^5R^6_2SiO_{1/2})_{a2}$,  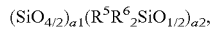

wherein $R^5$ is selected from similar or different alkenyl groups, the content of the alkenyl groups is 0.01-0.30 mol/100 g, $R^6$ is selected from alkenyl groups and similar or different alkyl groups that are univalent substituted or unsubstituted, wherein $0.5<a1<0.99$, $0.01<a2<0.5$, and $a1+a2=1$.

7. The organopolysiloxane composition according to claim 1, wherein, the component (A2) has the following average unit formula, $R^5R^6_2SiO(R^6_2SiO)_{a3}SiR^6_2R^5$,  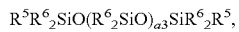

wherein $R^5$ is selected from similar or different alkenyl groups, the content of the alkenyl groups is 0.0001-0.01 mol/100 g, $R^6$ is selected from similar or different alkyl groups that are univalent substituted or unsubstituted, wherein $10<a3<10000$.

8. The organopolysiloxane composition according to claim 1, wherein, the component (B) has the following average unit formula, $R^8_3SiO(R^8_2SiO)_{b1}(R^8HSiO)_{b2}SiR^8_3$,  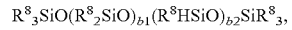

Wherein, $R^8$ is selected from similar or different alkyl groups that are univalent substituted or unsubstituted, wherein $0.2<b1<0.8$, $0.2<b2<0.8$, and $b1+b2=1$.

9. The organopolysiloxane composition according to claim 1, wherein, the component (C) has the following average unit formula:

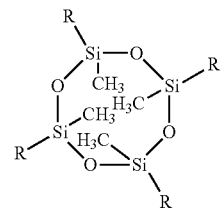

wherein, the R represents

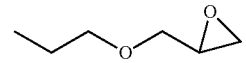

or a hydrogen atom.

10. A preparation method for an organopolysiloxane composition of claim 1, comprising the following steps:
blending the components (A1) and (A2) to obtain a mixed solution having a mixing viscosity of 6000 to 20000 mPa·s;
blending the components (B), (C) and (D) with the mixed solution; and
obtaining the composition.

11. A semiconductor component comprising a light-emitting component and a support configured to fix the light-emitting component, wherein the support is any one of a copper support, a mirror finish aluminum support, a ceramic substrate support, a COB support or an integrated support, and wherein the light-emitting component is coated with the cured substance of the organopolysiloxane composition of claim 1.

* * * * *